United States Patent [19]

Fukuda et al.

[11] 4,241,158
[45] Dec. 23, 1980

[54] VACUUM DEPOSITED ELECTROPHOTOGRAPHIC PHOTOSENSITIVE MEMBER

[75] Inventors: Tadaji Fukuda, Kawasaki; Teruo Misumi, Toride, both of Japan

[73] Assignee: Canon Kabushiki Kaisha, Tokyo, Japan

[21] Appl. No.: 972,280

[22] Filed: Dec. 22, 1978

[30] Foreign Application Priority Data

Dec. 28, 1977 [JP] Japan ................................ 52-160622

[51] Int. Cl.³ .......................................... G03G 5/082
[52] U.S. Cl. ....................................... 430/86; 430/84; 430/85; 430/128; 430/67; 252/501.1; 427/76; 427/78; 427/74
[58] Field of Search ............................ 96/1.5 R, 1.5 N; 252/501, 501.1; 427/74, 75, 76, 78; 430/128, 132, 84, 85, 86

[56] References Cited

U.S. PATENT DOCUMENTS

| | | | |
|---|---|---|---|
| 3,598,644 | 8/1971 | Goffe | 427/76 X |
| 3,666,554 | 5/1972 | Kanazawa et al. | 96/1.5 R |
| 3,775,109 | 11/1973 | Ohta et al. | 96/1.5 R |
| 4,008,082 | 2/1977 | Beschoner et al. | 96/1.5 R |
| 4,011,079 | 3/1977 | Berle et al. | 427/76 X |
| 4,094,675 | 6/1978 | Beschoner et al. | 427/76 X |
| 4,126,457 | 11/1978 | Ciuffini | 96/1.5 R |

OTHER PUBLICATIONS

Dessumer et al., "Xerography and Related Processes", 1965, Focal Press, pp. 96–97.
McNeil et al., "Selenium Coatings in the Thickness Range 0.2 to 2.5 μ p for Xerography", J. Photo. Sci., vol. 7, 1959, pp. 25–32.

*Primary Examiner*—Roland E. Martin, Jr.
*Attorney, Agent, or Firm*—Fitzpatrick, Cella, Harper & Scinto

[57] ABSTRACT

An electrophotographic photosensitive member having an amorphous deposition layer as a photoconductive layer, in which the amorphous deposition layer is formed by gradual increase in a substrate temperature during deposition of the photoconductive material.

7 Claims, 3 Drawing Figures

VACUUM DEPOSITED ELECTROPHOTOGRAPHIC PHOTOSENSITIVE MEMBER

BACKGROUND OF THE INVENTION

1. Field of the Invention

This invention relates to an electrophotographic photosensitive member, and particularly to an electrophotographic photosensitive member having an amorphous deposition layer as a photoconductive layer.

2. Description of the Prior Art

The electrophotographic photosensitive member takes various constructions to obtain predetermined characteristics or in conformity with the electrophotographic process to be adopted. The principal part of this electrophotographic photosenstive member is a photoconductive layer, the performance of which depends largely on the photoconductive layer.

Representative photoconductive layer which has heretofore been known is formed by vacuum-deposition of inorganic photoconductive materials such as S, Se, PbO, or alloys or intermetallic compounds, both of which contain therein S, Se, Te, As, Sb, Pb, etc. While the photoconductive layer formed by the vacuum-deposition has generally high sensitivity and is excellent in mechanical strength, there have been pointed out various problems still to be improved in respect of some of various electrophotographic characteristics. The main point to be improved is the so-called "fatigue phenomenon" which takes place when the photosensitive member is used repeatedly. This fatigue phenomenon is such one that emerges remarkably when the photosensitive member is used repeatedly at high speed. It is recognized from gradual lowering of image contrast in an electrostatic latent image to be formed during repetitive use of the photosensitive member, or from a ghost image to remain on a subsequently formed electrostatic latent image due to the previously formed electrostatic latent image not being completely removed.

For preventing such fatigue phenomenon with the photosensitive member having an insulating layer on its surface, there has so far been proposed in laid-open Japanese Patent Application No. 52-145037 (West German Offenlegungsschrift No. 2723925) a method of temporarily lowering the temperature of a substrate during the deposition, when a photoconductive material is deposited on the substrate to form a photoconductive layer thereon. However, the temporary decrease in the substrate temperature during the deposition requires a deposition apparatus of a complicated construction provided with a cooling device, as the result of which the deposition operation becomes also complicated.

SUMMARY OF THE INVENTION

It is an object of the present invention to provide a photosensitive member which does not produce the fatigue phenomenon as described above.

It is another object of the present invention to provide a photosensitive member free from the fatigue phenomenon and which can be manufactured with a simple operation.

It is still another object of the present invention to provide a photosensitive member suitable for high speed electrophotographic process.

It is other object of the present invention to provide a photosensitive member capable of forming an electrostatic latent image of high contrast by increasing the charge removing speed of the photosensitive member.

According to the present invention, there is provided an electrophotosensitive member having an amorphous deposition layer formed by deposition of a photoconductive material onto a substrate as the photoconductive layer, wherein said amorphous deposition layer is formed by gradually raising the substrate temperature during deposition of the photoconductive material.

Formation of an electrostatic latent image due to the electrophotographic process is by selective removal of electric charge (attenuation) in accordance with an image to be formed. The photosensitive member according to the present invention has the photoconductive layer of high charge removing speed, whereby the electrostatic latent image of high contrast can be formed. Such photoconductive layer of high charge removing speed can be formed by controlling the deposition conditions for forming the photoconductive layer. In other words, the deposition of the photoconductive material on the substrate is done by gradually raising the substrate temperature. The photoconductive layer which is formed by deposition while gradually raising the substrate temperature is found to be high in its light response speed in comparison with the conventional photoconductive layer which has been formed by deposition while maintaining the substrate at a constant temperature. Such high light response speed is considered due to more uniform state of free energy in atoms or molecules in the thickness direction of the photoconductive layer. When the substrate temperature is maintained constant, there takes place very large difference in time, in which the deposited part at the start of the deposition and the deposited part near the termination of the deposition are affected by the substrate temperature. For instance, when the photoconductive layer of 50 microns thick is formed at a deposition rate of 2 microns/min., the deposition time required is 25 minutes, on account of which there occurs a difference of more than 20 minutes for the deposited part at the start of the deposition and the deposited part near the termination of the deposition to be affected by the substrate temperature within the deposition chamber. This difference in time causes non-uniformity in the state of free energy in the constituent atoms or molecules with respect to the thickness direction of the photoconductive layer. As the consequence, moving speed of the charged carrier in the photoconductive layer at the time of exposure of the photosensitive member is considered to become non-uniform during its moving.

In contrast to this, the present invention is capable of eliminating such adverse effect arising from difference in time, in which the deposited part at the start of the deposition and the deposited part near the termination of the deposition are affected by the substrate temperature to a substantial extent. When the photoconductive material is deposited, vapor of the material contacts the substrate to become liquefied instantaneously and then solidified. At this instance, irregularity in the spatial arrangement of atoms and molecules of the photoconductive material is frozen, whereby a deposited layer of high state of free energy is formed. When the substrate temperature at the start of the deposition is low, the deposited layer is formed with a higher state of free energy, which gradually shifts to a more stable state of free energy by the termination of the deposition. On the other hand, when the substrate temperature near the end of the deposition is high, the deposited layer is formed with a lower state of free energy than when the substrate temperature is low. The thus formed layer is considered to have a generally uniform state of free energy, to have uniform and quick moving speed in the photoconductive layer of charged carrier, and to function as the photoconductive layer of high light response speed, as the result of which there is formed the photoconductive layer having very small residual charge, being free from light fatigue, and not showing the ghost phenomenon.

DESCRIPTION OF THE PREFERRED EMBODIMENTS

Figure 1:
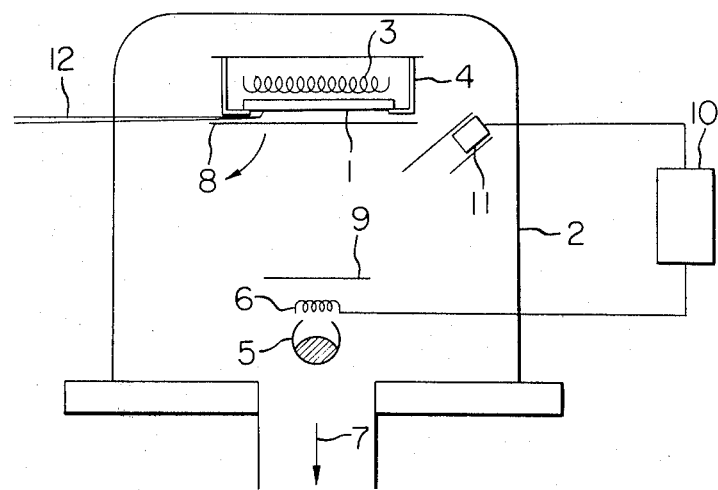
FIG. 1 is one embodiment of a deposition apparatus for use in the manufacture of the photosensitive member according to the present invention.

The rate of rise of the substrate temperature during the deposition of the photoconductive material may be appropriately set in accordance with desired characteristics of the photosensitive member as well as the kind of photoconductive material to be used. Usually, it is between 5° C. and 40° C., and more preferably, between 10° C. and 30° C. The upper and lower limits of the substrate temperature may also be appropriately set within a range, in which the amorphous deposition layer is formed. Generally, it is most preferable to control the substrate temperature within a range above the glass transition point of the photoconductive material and below the crystallization transition point thereof. For example, in the case of Se type photoconductive material, the glass transition point is from 40° to 55° C., and the crystallization transition point is from 90° to 100° C. It is therefore preferable that the substrate temperature be controlled within a range of from 40° to 85° C. The rate of rise of the substrate temperature during the deposition is determined by the deposition rate of the layer as well as the film thickness as desired. Generally, the increase in the substrate temperature is preferably carried out cntinuously, although it may be done stepwise, depending on necessity.

The most representative construction of the photosensitive member according to the present invention consists of a support member, or substrate, and a photoconductive layer.

The photoconductive layer is formed by vacuum deposition of various photoconductive materials such as, for example, S, Se, PbO, alloys and intermetallic compounds, both of which contain therein S, Se, Te, As, Sb, Pb, etc., and intermetallic compounds. Particularly preferable materials for the photoconductive layer are Se-type photoconductive materials such as Se, or those containing Se as the principle constituent such as SeTe, SeSb, SeBi, SeAs and SeTeAs, etc. Thickness of the photoconductive layer depends upon the kind of the photoconductive material to be used and the characteristic of the layer formed. In general, it is between 5 and 100 microns, or more preferably, between 10 and 70 microns, or so.

The substrate can be a metal plate made of stainless steel, copper, aluminum, tin, and so forth, or it can be formed of any other appropriate material such as paper, sheet, resin film etc.

As the other form of the photosensitive member according to the present invention, there may be exemplified one which is provided on its surface with an insulating layer. This insulating layer is provided for protecting the photoconductive layer, improvement in the mechanical strength of the photosensitive member, improvement in the dark attenuation characteristic, or application of the photosensitive member to a particular electrophotographic process (or avoiding environmental pollution), and others. Representative example of such particular electrophotographic process is one, in which movement of electric charge is caused even between the insulating layer and the photoconductive layer by injecting the electric charge from the side of the substrate at the time of the charging. Such method is disclosed representatively in U.S. Pat. No. 3,666,363 and U.S. Pat. No. 3,734,609, wherein the electrostatic latent image is formed by the primary charging, the secondary charging in the polarity opposite to that in the primary charging, or AC charge removal and simultaneous image exposure, and the overall exposure. In this system, the image exposure may be carried out prior to the secondary charging or the AC charge removal, or subsequent thereto. The overall exposure may be dispensed with. The insulating layer is set in an appropriate thickness in accordance with a desired characteristic.

In general, when the insulating layer is provided mainly for protecting the photosensitive member, improving its durability and dark attenuation characteristics, etc., the layer thickness is established relatively thin. On the other hand, the thickness of the insulating layer is established relatively thick, when the photosensitive member is used for a particular electrophotographic process. Usually, the thickness of the insulating layer is set between 0.1 and 100 μm, more preferably, between 0.1 and 50 microns.

The other kinds of resin to be used for forming the insulating layer are those which are usually used such as, for example, polyethylene, polyester, polypropylene, polystyrene, polyvinyl chloride, polyvinyl acetate, acrylic resin, polycarbonate, silicon resin, fluorine resin, epoxy resin, and so forth. The invention will be understood more readily by reference to the following examples; however, these examples are intended to illustrate the invention and are not to be construed to limit the scope of the invention.

EXAMPLE 1

At a predetermined position within a deposition chamber 2 as illustrated in FIG. 1, there is disposed an electrically conductive transparent glass substrate 1 having a size of 100 mm × 100 mm and a thickness of 15 mm with In$_2$O$_3$ having been deposited on its one side surface, in a manner to cause the side of the electrically conductive film to face the side of an evaporating boat 5. The substrate 1 is fixed to a fixing member 4 being separated by about 10 mm from a heater 3 to heat the same.

55 gr. of Se powder with purity of 99.999% is filled in the evaporating boat made of quartz. Over the boat 5, there is disposed a tungsten spiral heater 6, and then the air in the interior of the deposition chamber 2 is evacuated in the direction of an arrow 7 to maintain the degree of vacuum therewithin at approximately $5 \times 10^{-5}$ Torr.

Next, the heater 3 is ignited to raise a temperature of the substrate 1 upto 60° C., maintaining the same at this temperature level.

In the following, chronological changes in the substrate temperature and the deposition rate during the deposition will be explained in reference to FIG. 2. The tungsten heater 6 provided over the boat 5 is ignited to raise its temperature to 300° C. or so, thereby melting Se in the boat.

Figure 2:
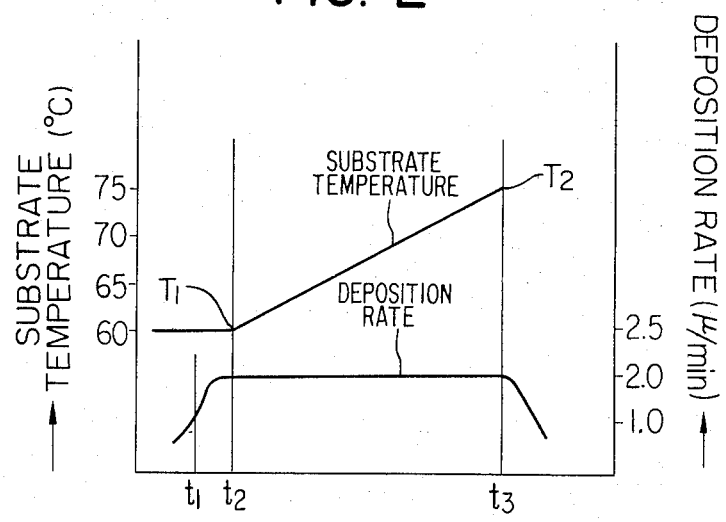
FIG. 2 is one embodiment of a control method of the substrate temperature for manufacturing the photoconductive layer of the photosensitive member of the present invention by deposition.

As shown in FIG. 2, a shutter 9 of the boat 5 is opened at a time instant $t_1$ when Se has become uniformly molten to thereby start deposition of Se on a crystal vibrator 11 for introducing an input signal to a deposition rate controller 10 and to control input of the tungsten heater 6 by the deposition rate controller 10 so that the deposition rate may be 2 microns/min. At a time instant $t_2$ when the deposition rate has become constantly controlled at 2 microns/min., a shutter 8 is opened to start the deposition on the substrate. At the same time electric current to flow through the heater 3 is adjusted to gradually and continuously raise the substrate temperature from 60° C. upward, controlling it to become 75° C. at the termination of the deposition. Measurement of the substrate temperature is done by means of a thermistor 12 fixed onto the substrate surface. At a time instant $t_3$ (25 minutes after $t_2$) when the deposition layer has attained a thickness of 50 microns, both shutters 8 and 9 are closed and the current to the tungsten heater 6 is disconnected, thereby terminating the Se-deposition. Then, the substrate 1 with the layer formed thereon is taken outside by breaking the vacuum of the deposition chamber, followed by coating of polycarbonate resin as an insulating material over its surface to a thickness of 25 microns, thereby completing the photosensitive member.

Figure 3:
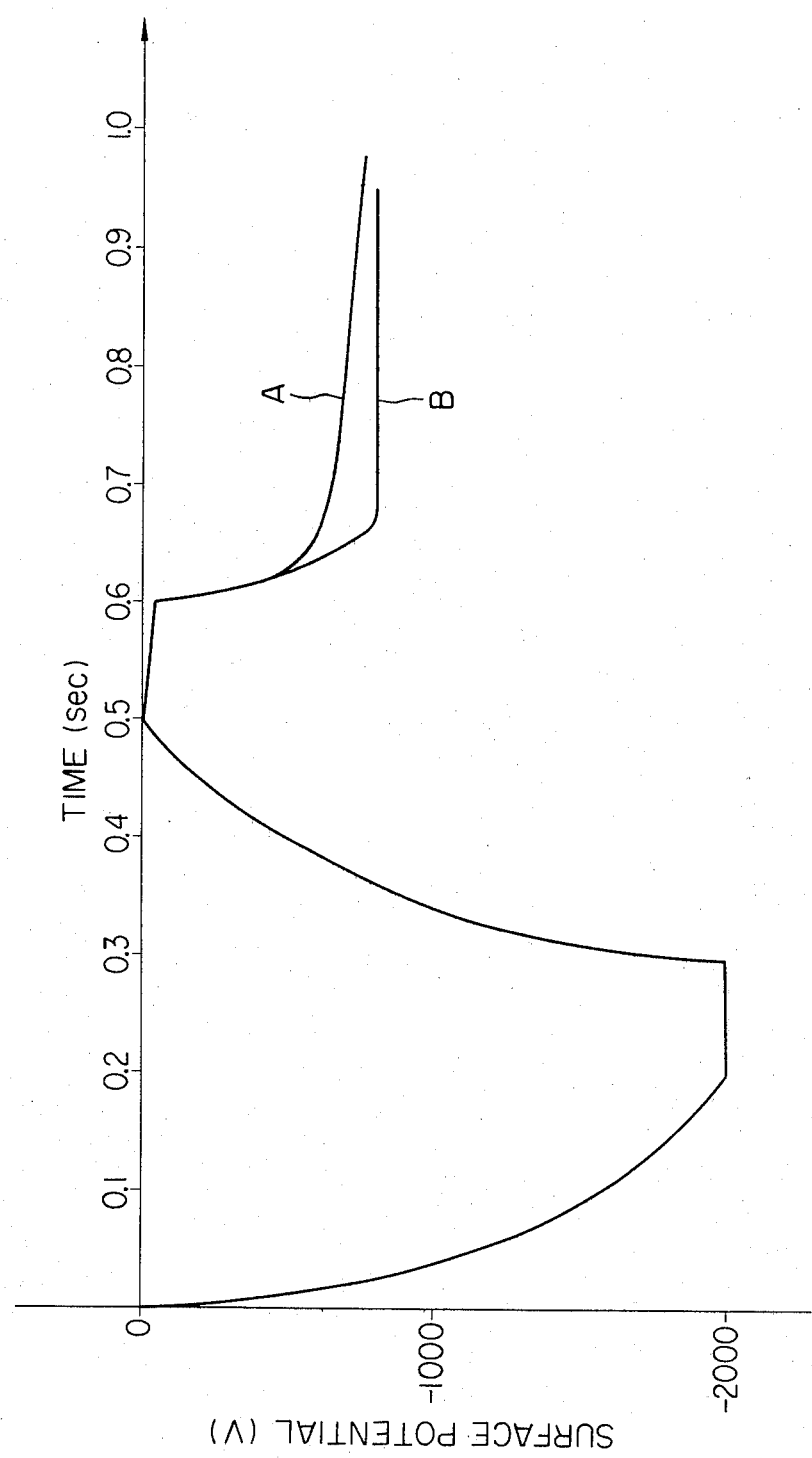
FIG. 3 is a graphical representation showing the electrophotographic characteristics of the photosensitive member according to the present invention.

The surface of this photosensitive member is charged to $-2,000$ V by conducting a negative corona discharge of $-5,500$ V as the primary charging for 0.2 second with simultaneous uniform irradiation from the side of the substrate. Subsequently, charge is removed from the surface of the insulating layer by conducting a positive corona discharge of $+6,000$ V for 0.2 second as the secondary charging. After this, overall exposure is uniformly done on the surface of the photosensitive member. The pontential changes at this time are shown in FIG. 3 by a curve B. The changing speed of the potential during the overall exposure process is remarkable in the case of the curve B in comparison with a curve A to be described later. That is, even when the abovementioned process is repeated for 3,000 times at a cycle of 6 seconds, there could be observed no change in the changing speed of the potential in the overall exposure process and the final potential, nor the undesirable ghost and repetitive fatigue.

REFERENCE EXAMPLE 1

Using the photosensitive member manufactured in the same manner as in Example 1 above with the exception that the deposition was conducted by maintaining the substrate temperature constantly at 60° C., the same processes of electric charging, charge removing, and overall exposure were carried out in the same manner as in Example 1. The results revealed that, as shown in FIG. 3 by the curve A, the changing speed of potential on the surface of the photosensitive member corresponding to the dark portion of the image during the overall exposure process is remarkably slow in comparison with the curve B.

It was further observed that, when this photosensitive member was used repeatedly with a short cycle of 6 seconds or so, the changing speed of the dark potential during the overall exposure process further decreased gradually, along with which the repetitive fatigue and ghost in the photosensitive member increased further.

EXAMPLE 2

An aluminum substrate 1 having a size of 100 mm × 100 mm and a thickness of 2 mm is disposed at a predetermined position in the deposition chamber 2, as shown in FIG. 1.

The substrate 1 is fixed to the fixing member 4 being separated by about 10 mm from the heater 3 to heat the same. Subsequently, 55 gr. of Se powder of 99,999% purity is filled in the quartz evaporating boat 5. Over the evaporating boat 5, there is disposed a tungsten spiral heater 6. Upon completion of such layout within the deposition chamber, it is evacuated in the direction as shown by the arrow 7 to maintain the degree of vacuum therewithin at approximately $5 \times 10^{-5}$ Torr. Next, the heater 3 is ignited to raise the substrate temperature to 60° C., maintaining the same at this temperature level.

The chronological changes in the substrate temperature and the deposition rate during the deposition will be explained hereinbelow in reference to FIG. 2.

The tungsten heater 6 over the evaporating boat 5 is ignited to raise the temperature of the boat to 300° C. or so, thereby melting Se in it.

As shown in FIG. 2, at a time instant $t_1$ when Se becomes uniformly molten, the shutter 9 is opened to start the Se deposition onto the crystal vibrator 11 to introduce an input signal to the deposition rate controller 10, whereby controlling the input of the tungsten heater 6 by the deposition rate controller 10 so that the deposition rate may become 2 microns/min. At a time instant $t_2$ when the deposition rate has become controlled at 2 microns/min., the shutter 8 is opened to commence the deposition onto the substrate. At the same time, electric current flowing through the heater 3 is adjusted to raise the substrate temperature continuously and gradually from its 60° C. level, controlling it to become 75° C. after termination of the deposition. Measurement of the substrate temperature is done by means of the thermistor 12 fixed onto the substrate surface. At a time instant $t_3$ (25 minutes after $t_2$) when the film thickness of the deposition layer has reached 50 microns, the shutters 8 and 9 are closed, and the current through the tungsten heater 6 is disconnected, thereby terminating the Se deposition. The substrate 1 with the deposited layer formed thereon is taken outside by breaking the vacuum condition of the chamber, and is operated as follows.

The surface of this photosensitive member is charged to $+1,000$ V by effecting a positive corona discharge of $+6,000$ V for 0.2 second. Subsequently, a half of the surface is subjected to irradiation of light of 40 lux·sec. Immediately after this light irradiation, the electric potential of the photosensitive member surface is measured. It is found out that the surface potential $V_D$ of the portion where no light irradiation has been effected is 900 V, while the surface potential $V_L$ of the portion where the light irradiation has been carried out is zero V. The electrostatic contrast as measured is 900 V. Even when the abovementioned processes of positive charging, light irradiation of half of the surface, and measurement of the surface potential are repeated for 3,000 times with a cycle of 6 seconds, there is no change in the positive charge quantity, and the surface potentials $V_D$ and $V_L$ from those of the initial.

REFERENCE EXAMPLE 2

Using the photosensitive plate manufactured in the same manner as in Example 2, with the exception that the deposition was conducted with the substrate temperature being maintained at 60° C., constant, the same processes of positive charging, light irradiation on a half surface, and surface potential measurement as in Example 2 were repeatedly carried out with a cycle of 6 seconds. The surface potentials $V_D$ and $V_L$ at the initial time were 950 V and 50 V, respectively, and the surface potentials $V_D$ and $V_L$ after 3,000 times were 970 V and 200 V, respectively, from which considerable fatigue phenomenon could be observed.

EXAMPLE 3

Using the photosensitive member manufactured in the same manner as in Example 1 with the exception that the deposition was carried out with Se-Te alloy (Te content of 10 wt.%) as the material to be filled in the quartz deposition boat 5, the same process of electric charging, charge removing, and the overall exposure as in Example 1 were conducted. It was observed as the result of the processes that the changing speed in the potential during the overall exposure process was very fast. Even when the abovementioned processes were repeated for 3,000 times with a cycle of 6 seconds, the changing speed in the electric potential, and the final potential value were not changed, and no repetitive fatigue was observed.

EXAMPLE 4

Se-Te powder (Te content of 20 wt.%) was used in place of Se powder as the photoconductive material in Example 2. The boat temperature was maintained at 350° C., and the substrate temperature was raised gradually and continuously from 45° C. so that it may be at 70° C. at the termination of the deposition. In other aspects, exactly the same processes as in Example 2 were followed to thereby form a deposition layer of 50 microns thick on the aluminum substrate. Next, polycarbonate resin was coated on the surface of the deposited layer to a thickness of 25 microns to form the insulating layer, thereby obtaining the photosensitive member.

The thus obtained photosensitive member was subjected to a negative corona discharge of −5,500 V for 0.2 second as the primary charging, and, simultaneously, uniform light irradiation was done from the substrate side to charge the surface of the photosensitive member at −2,000 V. Subsequently, it was subjected to a positive corona discharge of +6,000 V for 0.2 second as the secondary charging to remove electric charge on the surface of the insulating layer, followed by uniform overall exposure of the surface of the photosensitive surface.

In practicing these processes repeatedly, there could not be found out substantial difference between the surface potential of the photosensitive member observed after the initial process and that observed after 3,000 times of the repeated processes with a cycle of 6 seconds. No fatigue phenomenon could therefore be observed.

EXAMPLE 5

50 microns thick of the deposition layer was formed on an aluminum substrate in the same manner as in Example 2 with the exception that Se-As alloy (As content of 2 wt.%) was used in place of Se powder as the photoconductive material in Example 2, that the boat temperature was maintained at 320° C., and that the substrate temperature was raised gradually and continuously from 65° C. so that it may be at 85° C. at the termination of the deposition. Subsequently, polycarbonate resin was coated on the surface of the deposited layer to a thickness of 25 microns, thereby forming the insulating layer.

The thus obtained photosensitive member was subjected to a negative corona discharge of −5,500 V for 0.2 second as the primary charging, and at the same time uniform light irradiation was conducted from the substrate side to thereby charge the surface of the photosensitive member to −2,000 V. Subsequently, the positive corona discharge of +6,000 V. was effected as the secondary charging for 0.2 second to remove electric charge on the surface of the insulating layer, followed by uniform overall exposure on the surface of the photosensitive member. It was found out that, in practicing these processes, there could not be found out substantial difference between the surface potential of the photosensitive member observed after the initial process and that observed after 3,000 times of the repeated processes with a cycle of 6 seconds. No fatigue phenomenon of the photosensitive member could be observed.

Incidentally, improvement in the light response speed was also observed by control of the substrate temperature as described in the present specification, even when SeSb, SeTeAs, etc. are used as the photoconductive material.

What is claimed is:

1. In an electrophotographic photosensitive member having an inorganic amorphous vacuum deposition layer formed by deposition of a photoconductive material onto a substrate as the photoconductive layer, the improvement wherein said inorganic amorphous deposition layer is formed by gradually raising the substrate temperature within a range above the glass transition point of the photoconductive material and below the crystallization transition point thereof during the deposition of the photoconductive material.

2. The electrophotographic photosensitive member as claimed in claim 1, wherein the amount of temperature rise of the substrate during deposition is between 5° C. and 40° C.

3. The electrophotographic photosensitive member as claimed in claim 1, wherein an insulating layer is provided on said photoconductive layer.

4. The electrophotographic photosensitive member as claimed in claim 1, wherein the thickness of said photoconductive layer ranges from 5 to 100 microns.

5. In an electrophotographic photosensitive member having an inorganic amorphous vacuum deposition layer formed by deposition of Se or a photoconductive material containing Se onto a substrate as a photoconductive layer, the improvement wherein said inorganic amorphous deposition layer is formed by gradually raising the substrate temperature within a range above the transition point of the Se or the photoconductive material containing Se and below the crystallization transition point thereof during the deposition of the Se or photoconductive material containing Se.

6. The electrophotographic photosensitive member as claimed in claim 5, wherein the substrate temperature is raised continuously in a temperature range of from 40° to 85° C.

7. The electrophotographic photosensitive member as claimed in claim 5, wherein said photoconductive material containing Se is an alloy containing Se as a principal constituent and at least one element selected from the group consisting of Te, Sb, Bi and As.

* * * * *